United States Patent
Dai (10) Patent No.: US 9,929,342 B2
(45) Date of Patent: Mar. 27, 2018

(54) INK-JET PRINTING METHOD AND MANUFACTURING METHOD OF OLED DISPLAY DEVICE

(71) Applicant: BOE TECHNOLOGY GROUP CO., LTD., Beijing (CN)

(72) Inventor: Qing Dai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/234,707

(22) Filed: Aug. 11, 2016

(65) Prior Publication Data

US 2017/0279049 A1    Sep. 28, 2017

(30) Foreign Application Priority Data

Mar. 23, 2016    (CN) .......................... 2016 1 0169953

(51) Int. Cl.
| | | |
|---|---|---|
| H01L 51/56 | (2006.01) | |
| H01L 51/00 | (2006.01) | |
| H01L 27/32 | (2006.01) | |
| B41J 2/01 | (2006.01) | |

(52) U.S. Cl.
CPC ............ *H01L 51/0005* (2013.01); *B41J 2/01* (2013.01); *H01L 27/3246* (2013.01); *H01L 51/56* (2013.01)

(58) Field of Classification Search
CPC ............................ H01L 27/32; H01L 27/3246
See application file for complete search history.

(56) References Cited

U.S. PATENT DOCUMENTS

| | | | | |
|---|---|---|---|---|
| 6,307,083 | B1 * | 10/2001 | Igarashi | ................ C07F 7/0812 |
| | | | | 313/504 |
| 7,294,856 | B2 * | 11/2007 | Ito | ....................... H01L 27/3246 |
| | | | | 257/13 |
| 8,021,841 | B1 * | 9/2011 | Schatz | ................... B82Y 30/00 |
| | | | | 435/6.1 |

(Continued)

FOREIGN PATENT DOCUMENTS

| | | |
|---|---|---|
| CN | 1703122 A | 11/2005 |
| CN | 1933101 A | 3/2007 |

(Continued)

OTHER PUBLICATIONS

China First Office Action, Application No. 201610169953.X, dated Oct. 18, 2017, 17 pps.: with English translation.

*Primary Examiner* — Kyoung Lee
*Assistant Examiner* — Christina Sylvia
(74) *Attorney, Agent, or Firm* — Armstrong Teasdale LLP (57) ABSTRACT

Embodiments of the present disclosure provide an ink-jet printing method and a manufacturing method of an OLED display device. The ink-jet printing method includes printing a first ink within a groove defined by a pixel defining layer, such that the first ink forms a first thin film by a drying process, the first thin film covering an inner surface of a lyophilic portion of the pixel defining layer; removing a central portion of the first thin film, the central portion being located at the bottom of the groove; and printing a second ink into the groove covered with the first thin film, such that the second ink forms a second thin film by the drying process.

20 Claims, 5 Drawing Sheets

(56) References Cited

U.S. PATENT DOCUMENTS

| | | | |
|---|---|---|---|
| 2006/0227264 A1* | 10/2006 | Noda | B82Y 10/00 349/108 |
| 2009/0029032 A1* | 1/2009 | Miyasaka | B41J 2/04525 427/64 |
| 2010/0133998 A1* | 6/2010 | Nishikawa | H01L 51/5268 313/505 |
| 2010/0181559 A1* | 7/2010 | Nakatani | H01L 27/3246 257/40 |
| 2011/0042656 A1* | 2/2011 | Burroughes | H01L 27/3246 257/40 |
| 2011/0227100 A1* | 9/2011 | Kurihara | H01L 27/3246 257/88 |
| 2016/0056218 A1* | 2/2016 | Wang | H01L 51/0004 257/40 |

FOREIGN PATENT DOCUMENTS

| | | |
|---|---|---|
| CN | 103413819 A | 11/2013 |
| CN | 104409653 A | 3/2015 |
| CN | 104659287 A | 5/2015 |
| CN | 104795426 A | 7/2015 |
| CN | 104882468 A | 9/2015 |
| JP | 2008218250 | 9/2008 |

\* cited by examiner

INK-JET PRINTING METHOD AND MANUFACTURING METHOD OF OLED DISPLAY DEVICE

CROSS REFERENCE TO RELATED APPLICATIONS

The present application claims the priority of Chinese patent application No. 201610169953.X, filed on Mar. 23, 2016, the disclosure of which is hereby entirely incorporated by reference.

BACKGROUND

Embodiments of the present disclosure relate to an ink-jet printing method and a manufacturing method of an OLED display device.

In the fields of Organic Light Emitting Diode (OLED) and Liquid Crystal Display (LCD), methods such as ink-jet printing method are usually used to form a thin film made of an organic functional layer or a color film structure, wherein the ink-jet printing method is one of wet film forming processes. Such a wet film forming process generally comprises an indispensable step of removing unwanted solvent by subsequent process, thereby drying and forming the desired thin film. This drying process for removing the solvent determines the topography of the formed thin film. For a photoelectric display device, whether the topography and uniformity of the dried thin film is good or bad, has a great influence on the lifetime and display effect of the device.

Figure 1:
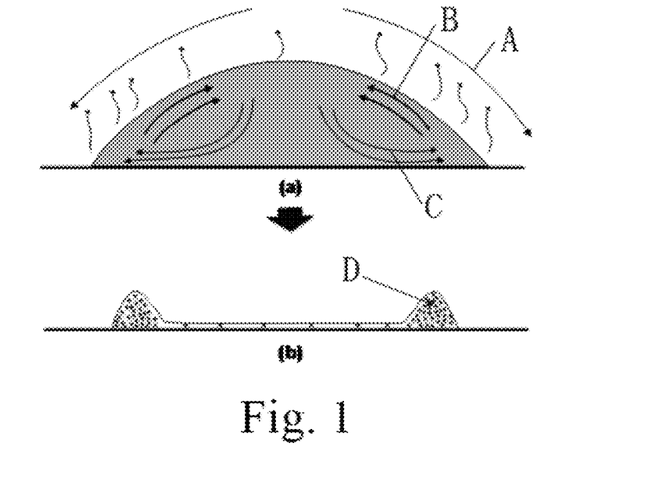
FIG. 1 is a schematic principle diagram for explaining the process of forming a coffee ring phenomenon.

FIG. 1 is a schematic principle diagram for explaining the process in which an ink droplet dries on a flat surface to result in coffee ring phenomenon. After an ink droplet drops into a substrate or a pixel, due to the shape of the ink droplet, i.e., due to the formation of the surface tension change curve A, the central portion of the ink droplet with smaller volume and unit areas has a different evaporation rate than the edge portion with larger volume and unit areas. Thus, the drying rate of the ink in the edge portion is faster. As the solvent in the edge portion continuously evaporates, the solid content distribution in the central portion becomes different from that in the edge portion, such that there exists a concentration gradient (difference) between the central and edge portions, thereby causing the capillary compensation phenomenon that the solvent flows from the central portion to the edge portion. The flow direction C of the capillary compensation is shown in the figure. Such flow of the solvent certainly will drive part of the solute to migrate to the edge portion, such that the amount of the solute in the edge portion continuously increases, finally resulting in the formation of the coffee ring effect. In addition to the above-mentioned capillary compensation flow from the center to the edge of the ink droplet, there exists inside the ink droplet a Marangoni convection phenomenon in the inverse direction. The direction B of the Marangoni convection is shown in the figure. The dried topography of the final thin film is the result decided by both these micro-flow effects. The study found that the root cause of the Marangoni convection phenomenon is the surface tension gradient (difference) between different parts inside an ink droplet. Many factors such as temperature gradient, concentration gradient, change of solvent composition, and so on, may cause the generation of this surface tension gradient (difference).

In addition, the formation of the coffee ring effect requires a condition, i.e., the pinning effect of the contact line between the ink droplet and the interface. The moving and pinning of the contact line is a complex process influenced by ink characteristics (such as boiling point, viscosity, surface tension and the like), lyophilic and lyophobic properties of the interface material, the magnitude of the interfacial tension between liquid and solid, and the like. FIG. 1(b) shows a cross-sectional view of a thin film formed after the droplet having the coffee ring effect dries on the flat surface. It can be seen that after the droplet is dried, the thickness of the edge portion is significantly greater than that of the center. This results from the combined action of the interfacial pinning effect and the solute migration due to the Marangoni convection phenomenon inside the droplet during the drying process.

In the actual preparation of a display device, the shape of a pixel is the shape of its boundary defined by a layer of so-called pixel defining layer material. With respect to the solution preparation process such as ink-jet printing process, there are some additional requirements for the pixel defining layer. One requirement is that the thickness may be great (typically 1-2 µm) for storing the printed ink during the preparation process. Another and more important requirement is that the surface of its material must have strong lyophobic property, to avoid the mixing of ink between adjacent pixels, and at the same time to make the falling ink droplets with slight offsets (i.e., the falling ink droplets dropped on the inner edge of the pixel) roll into the pixel pit.

Figure 2:
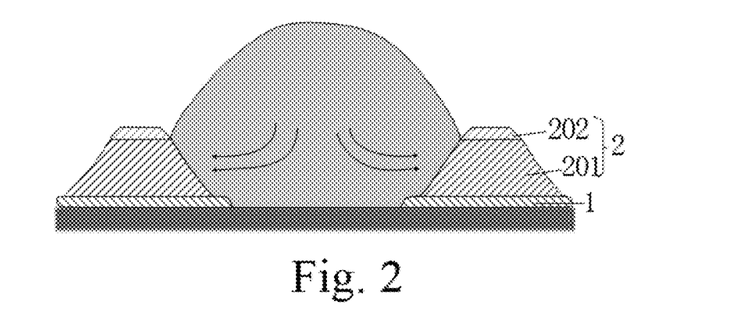
FIG. 2 is a schematic cross-sectional view showing the case where the ink droplet drops into a pixel with a pixel defining layer.
Figure 3:
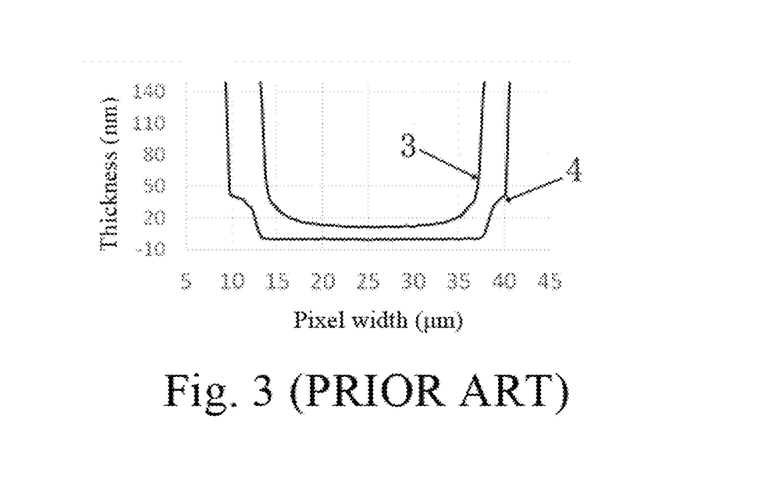
FIG. 3 is a schematic cross-sectional view showing the contour of a thin film made by using the prior art.

The usage of the pixel defining layer can increase the pinning effect of the contact line, such that in the entire drying process, the contact line is always fixed at the edge of the pixel defining layer, thereby increasing the coffee ring effect. In particular, only a very thin layer at the surface of the currently used pixel defining layer material has lyophobic property, while the lower layer occupying its majority is lyophilic. FIG. 2 is a schematic cross-sectional view showing the topography where the ink droplet drops into a groove defined by the defining pixel layer. FIG. 3 is a schematic cross-sectional view showing the contour of the thin film actually measured after drying. It can be seen from FIG. 3 that most of the organic functional material 3 (such as hole injection layer material) is located at the portion within the pixel close to the edge 4 of the pixel defining layer, such that it is difficult to guarantee the flatness of the thin film, resulting in uneven luminance of the device as well as great decrease in utilization efficiency of the material.

It can be known from the above introduction that several conditions should be met to form the coffee ring effect. One condition is the Marangoni convection phenomenon during the evaporation process of the solvent. Another condition is the pinning effect of the solute during the drying process. To reduce the coffee ring effect, the existing technical solutions mainly aim at changing the Marangoni convection phenomenon, such as by adding ellipsoidal particles into the ink, by adjusting the pH value of liquid, by adding a second component solvent or additive, and by electrowetting method and the like. For example, Kajiya Tadashi et al. (Controlling the Drying and Film Formation Processes of Polymer Solution Droplets with Addition of Small Amount of Surfactants) improved the Marangoni convection phenomenon by adding a small amount of surfactants into the ink to change the surface tension difference between different parts of the ink droplet during the drying process, thereby achieving the effect of improving the flatness of the dried thin film. In general, the above methods can play a certain role of reducing the coffee ring effect. However, for an OLED, the additives such as surfactants often result in the decrease in device performance, and thus are difficult to use in the OLED structure.

Furthermore, all of the above methods are solutions targeted for droplet spreading and drying processes on a flat surface. There are rarely methods suitable for pixelated drying process. That is, the influence of properties of the pixel defining layer on the topography of the dried thin film has not been considered. As shown in FIG. 2, the pixel defining layers used by existing ink-jet printing processes mostly have a two-layer structure. The first defining layer 1 is lyophilic, and the second defining layer 2 is an organic resin structure. Only a thin layer 202 at the surface of the second defining layer 2 has lyophobic property, while the lower part 201 occupying most of the thickness still has lyophilic property. This results in that when the printed organic functional ink is drying, the contact line is fixed at the lyophilic-lyophobic interface of the second defining layer 2. That is, the pinning effect occurs. Then, due to the coffee ring effect, the serious edge climbing phenomenon occurs that the thin film exhibits a thin center and a too thick edge. FIG. 3 shows the topography of the thin film formed after drying. This is a specific exhibition of the coffee ring effect inside a pixel having a pixel defining layer.

Therefore, based on the material and structural properties of existing pixel defining layers, after OLED functional material (such as hole injection layer material) is ink-jet printed into a pixel, the serious climbing phenomenon will occur that the formed thin film exhibits a thin center and a too thick edge due to the coffee ring effect during the drying process.

BRIEF DESCRIPTION

One aspect of the present disclosure provides an ink-jet printing method, which can solve the problem that when an OLED display device is prepared by ink-jet printing within a pixel, the structure of the conventional pixel defining layer causes the edge climbing phenomenon that the thin film exhibits a thin center and a too thick edge.

The ink-jet printing method according to an embodiment of the present disclosure comprises steps of: printing a first ink within a groove defined by a pixel defining layer, such that the first ink forms a first thin film by a drying process, the first thin film covering an inner surface of a lyophilic portion of the pixel defining layer; removing a central portion of the first thin film, the central portion being located at the bottom of the groove; and printing a second ink into the groove covered with the first thin film, such that the second ink forms a second thin film by the drying process.

Further, the cross-sectional shape of the pixel defining layer is a forward trapezoid or a reverse trapezoid.

Further, the pixel defining layer comprises a first defining layer formed on a substrate and a second defining layer located on the first defining layer, the first defining layer and the lower portion of the second defining layer being the lyophilic portion, and the upper portion of the second defining layer being a lyophobic portion.

For example, the material of the first defining layer is silicon oxide or silicon nitride, and the material of the second defining layer is polymer resin.

Further, the solute of the first ink is low surface energy material.

Further, the solute of the first ink comprises fluorine-containing resin or fluorine-containing dendritic macromolecule material.

Further, the central portion of the first thin film located at the bottom of the groove is removed by an ashing process.

Further, the ashing process comprises plasma bombardment, particle beam bombardment or ultraviolet irradiation.

Further, the material of the second ink is organic functional material.

Further, the material of the second ink comprises hole injection layer material.

The manufacturing method of an OLED display device according to an embodiment of the present disclosure comprises the steps of the ink-jet printing method described above.

Based on the ink-jet printing method according to the embodiment of the present disclosure, a small amount of lyophobic first ink component is printed within a pixel firstly, such that the lyophilic portion on the inner surface of the pixel defining layer of the pixel is covered by the lyophobic first ink component after drying. After removing the first ink component located at the central portion of the pixel by an ashing process, a second ink component is then printed within the pixel. Because the lyophilic portion on the interface of the second defining layer has been covered by the solute component of the lyophobic first ink, the pinning effect of the second ink component in the pixel is greatly reduced, thereby allowing the topography of the formed thin film to be improved. Thereby, the problem can be effectively overcome that when an OLED display device is prepared by ink-jet printing within a pixel, the structure of the conventional pixel defining layer causes the edge climbing phenomenon that the thin film exhibits a thin center and a too thick edge.

BRIEF DESCRIPTION OF THE DRAWINGS

In order to illustrate the present disclosure more clearly, the drawings of embodiments will be introduced briefly below. Apparently, the schematic structural diagrams in the following drawings are not necessarily drawn in scale, but present various features in a simplified form. Moreover, the drawings in the following description relate merely to some embodiments of the present disclosure, but should not be construed as limiting the present disclosure.

DETAILED DESCRIPTION

In order to make the present disclosure apparent, embodiments of the present disclosure will be described clearly and completely hereinafter in conjunction with the drawings of embodiments of the present disclosure. Apparently, embodiments described herein are merely a part of but not all embodiments of the present disclosure. Based on embodiments of the present disclosure described herein, those skilled in the art can obtain other embodiments without any creative work, which should be within the scope of the present disclosure.

Embodiment I

Figure 5A:
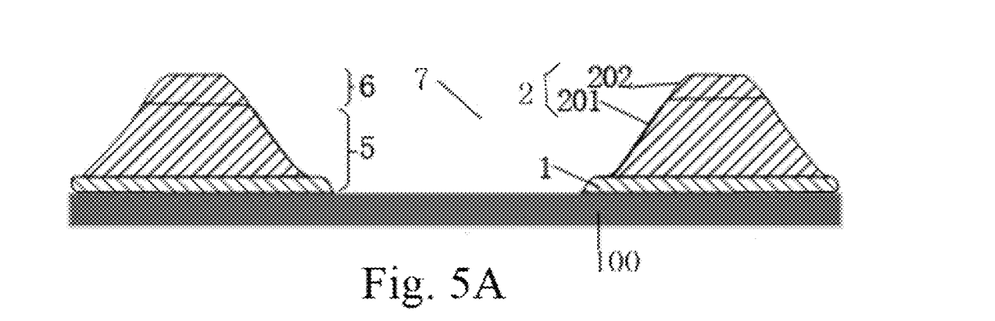
FIGS. 5A to 5C are schematic principle diagrams for explaining the manufacturing process of a first thin film in Embodiment I of the present disclosure.

The present embodiment provides an ink-jet printing method targeted for the case where the shape of a pixel defining layer is a conventional forward trapezoid two-layer structure. As shown in FIG. 5A, the pixel defining layer is a two-layer structure comprising a first defining layer 1 formed on a substrate 100 and a second defining layer 2 formed on the first defining layer 1. The first defining layer 1 usually consists of inorganic lyophilic material such as silicon oxide or silicon nitride. The second defining layer 2 has for example polymer resin as its material, wherein the top portion 202 of the second defining layer 2 is lyophobic, and the lower portion 201 is lyophilic. The first defining layer 1 and the lower portion 201 of the second defining layer 2 constitute a lyophilic portion 5 of the pixel defining layer, and the top portion 202 of the second defining layer 2 constitutes a lyophobic portion 6. Further, the width of the first defining layer 1 is greater than that of the second defining layer 2, and the width of the pixel defining layer as a whole gradually decreases from the bottom up. The thickness of the first defining layer 1 is thinner than that of the second defining layer 2. In general, the thickness of the first defining layer 1 is smaller than 100 nm.

Figure 4:
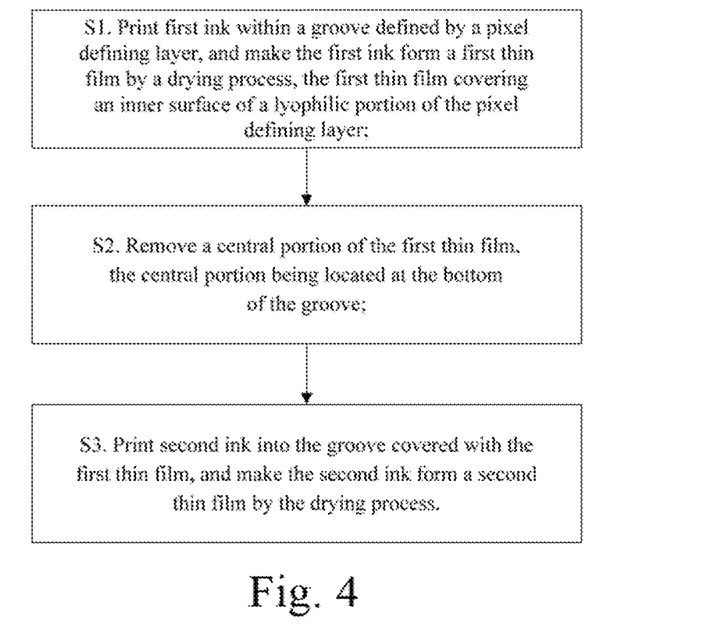
FIG. 4 is a flowchart of an ink-jet printing method according to an embodiment of the present disclosure.

As shown in FIG. 4, the ink-jet printing method of the present embodiment comprises the following steps.

Figure 5B:
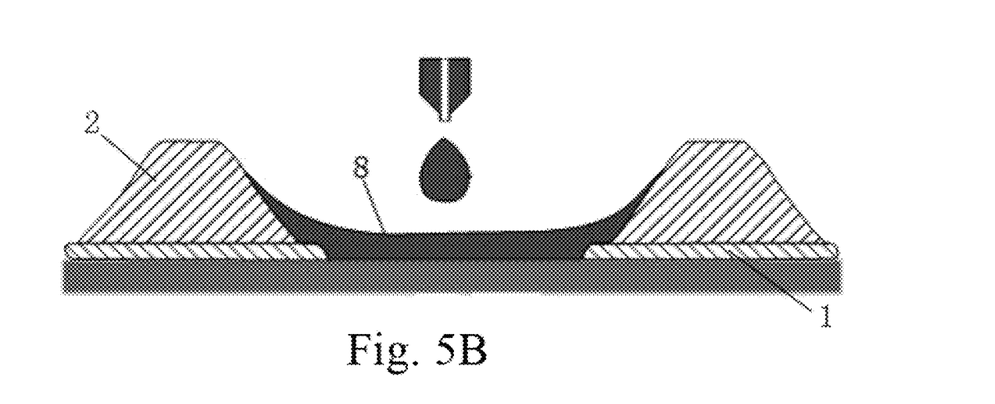

As shown in FIG. 5B, in step S1, a small amount of a first ink 8 is filled within a groove 7 defined by the pixel defining layer by using an ink-jet printing method. The solvent of the first ink 8 is selected to have the ability to generate a serious coffee ring effect. That is, all or most of the solute is attached to an inner edge portion of the pixel defining layer after drying. The solute of the first ink 8 should have such property that the solute thin film formed after drying has a low surface energy toward the surface layer within the pixel. Accordingly, the material selected for the solute of the first ink 8 is low surface energy material. In the present embodiment, the material that may be used as the solute of the first ink 8 comprises fluorine-containing polymer resin or fluorine-containing dendritic macromolecule material.

After the first ink 8 has been printed, by a drying process, the first ink 8 is made to form a first thin film 9 which covers the inner surface of the lyophilic portion 5 located at the bottom of the pixel defining layer at the edge of the pixel. It should be noted that the phenomenon is caused due to the following reasons. The lower portion 201 of the second defining layer 2 has lyophilic property, causing an upper edge of the first ink 8 to have a serious pinning effect on the inner surface of the lower portion. In conjunction with the adjustment of the drying process, the components of the first ink 8 generate a serious coffee ring effect during the evaporation process. That is, most or all of the solute climbs onto the inner surface of the lyophilic portion 5 of the pixel defining layer. The formed structure is shown in FIGS. 5B and 5C.

In this step, the amount of the first ink 8 is not specially limited as long as it ensures that the first ink 8 can cover the lyophilic portion 5 of the pixel defining layer after drying. Further, the amount of the first ink 8 may be such that no liquid or as little liquid as possible of the undried first ink 8 remains at the central portion of the pixel.

Figure 5C:
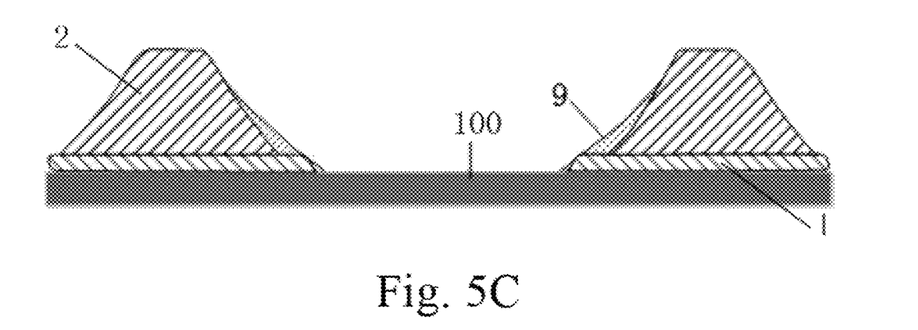

As shown in FIG. 5C, in step S2, the central portion of the first thin film 9 located at the bottom of the groove is removed. After drying, the solvent of the first ink 8 has been evaporated, and the remaining solute forms the first thin film 9. The central portion of the first thin film 9 is removed, leaving only the edge portion of the first thin film 9. The method for removing the central portion of the first thin film 9 employs an ashing process. The ashing process comprises plasma bombardment, particle beam bombardment, ultraviolet irradiation, or sputtering, etc.

Figure 6A:
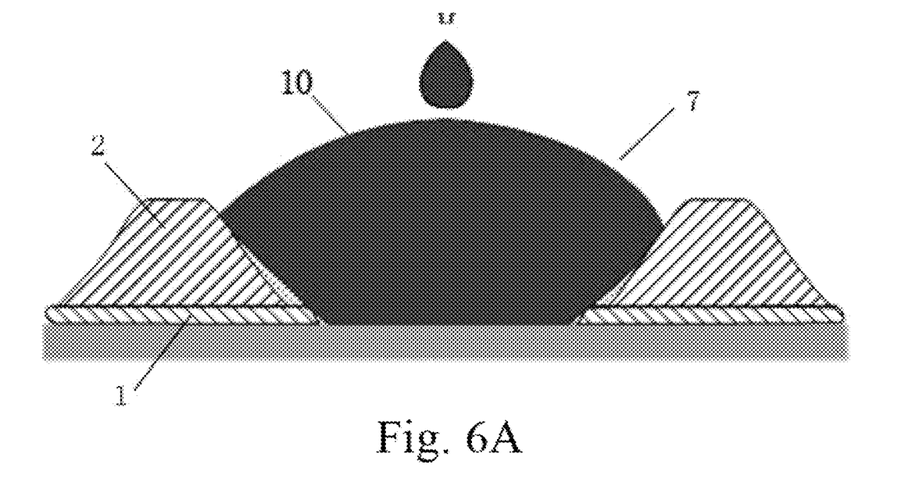
FIGS. 6A to 6B are schematic principle diagrams for explaining the manufacturing process of a second thin film in Embodiment I of the present disclosure.
Figure 6B:
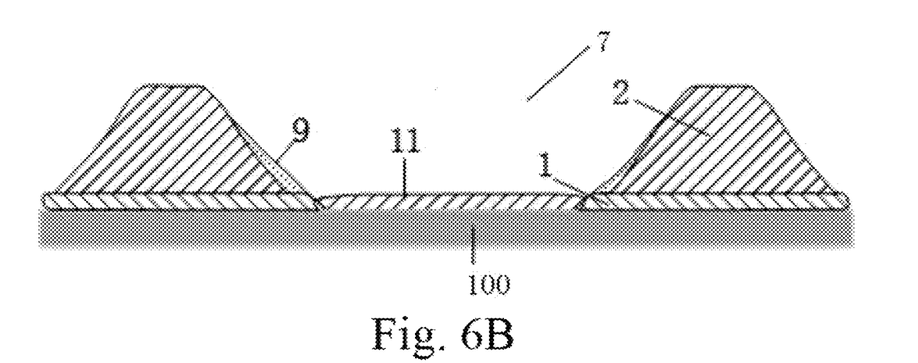

As shown in FIGS. 6A to 6B, in step S3, a second ink 10 is printed within the groove 7 covered with the first thin film 9 described above. The material of the second ink 10 is organic functional material. Optionally, the material of the second ink 10 is hole injection layer material. By a drying process, the second ink 10 is made to form a second thin film 11 that completely covers the surface of the first thin film 9 adjacent the first defining layer 1. Because the lyophilic portion 5 at the inner edge of the pixel defining layer is covered by the lyophobic first thin film 9, the pinning effect of the second ink 10 thereon is greatly decreased, such that the topography of the formed thin film can be improved well to form a uniform thin film. Thereby, the thin film formed after an OLED functional material layer (such as hole injection layer material) is printed into a pixel can achieve good flatness.

Embodiment II

The present embodiment provides an ink-jet printing method targeted for the case where the shape of the pixel defining layer is a reverse trapezoid two-layer structure. Its principle is basically the same as the ink-jet printing method in Embodiment I, and the specific method steps are similar to those in Embodiment I.

Figure 7A:
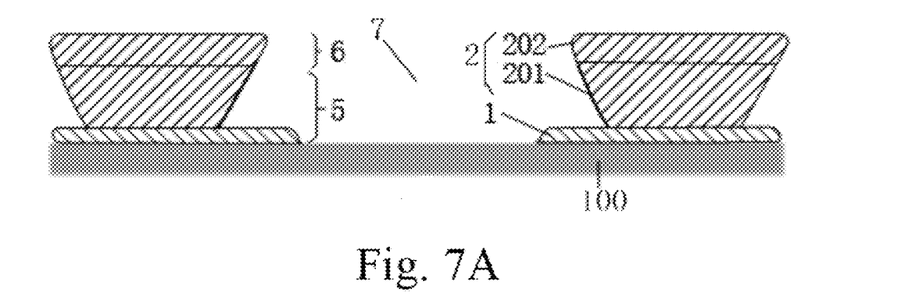
FIGS. 7A to 7C are schematic principle diagrams for explaining the manufacturing process of a first thin film in Embodiment II of the present disclosure.

The difference between the two embodiments lies in that the structure of the pixel defining layer of Embodiment II is different from that of Embodiment I. As shown in FIG. 7A, the width of the first defining layer 1 is greater than that of the second defining layer 2, and the second defining layer 2 employs a reverse trapezoid structure (that is, the cross-section of the second defining layer 2 has a structure which is big in the upper part and is small in the lower part. This structure has the following advantages. Firstly, there is a triangular area between the inner surface of the second defining layer 2 close to the groove and the upper surface of the first defining layer 1. This triangular area can enhance capillary action, causing more components of the first ink 8 to be close to the edge. Thereby, the coffee ring effect can be enhanced, such that more solute components of the first ink 8 climb onto the inner surface of the lyophilic portion 5. Secondly, due to the above action, under the premise of ensuring the same effect as Embodiment I, the amount of the first ink 8 printed into the pixel can be reduced, which in turn can reduce the first solute components that may remain at the central portion of pixel, and is more advantageous for the subsequent removing process.

The ink-jet printing method of the present embodiment comprises the following steps.

Figure 7B:
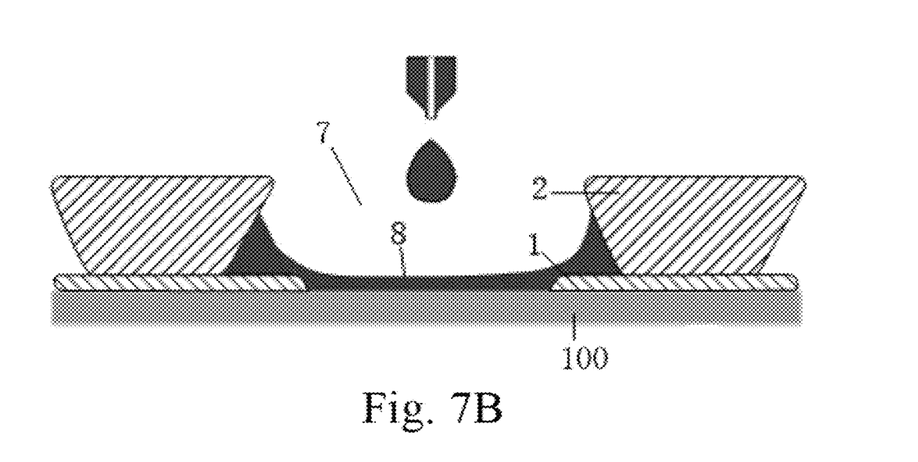

As shown in FIG. 7B, in step S1, a small amount of first ink 8 is filled within a groove 7 defined by the pixel defining layer by using an ink-jet printing method. The solvent of the first ink 8 is selected to have the ability to generate a serious coffee ring effect. That is, all or most of the solute is attached to an inner edge portion of the pixel defining layer after drying. The solute of the first ink 8 should have such property that the solute thin film formed after drying has a low surface energy toward the surface layer within the pixel. Accordingly, the material selected for the solute of the first ink 8 is low surface energy material. In the present embodiment, the material that may be used as the solute of the first ink 8 comprises fluorine-containing polymer resin or fluorine-containing dendritic macromolecule material.

Figure 7C:
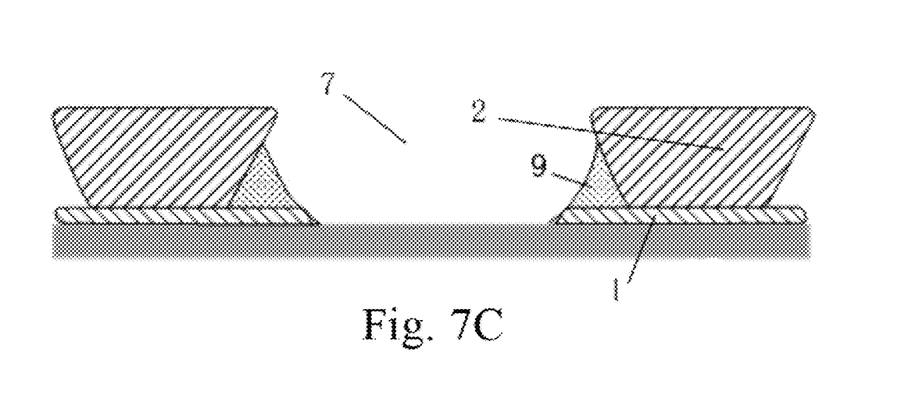

After the first ink 8 has been printed, by a drying process, the first ink 8 is made to form a first thin film 9 which covers the inner surface of the lyophilic portion 5 located at the bottom of the pixel defining layer at the edge of the pixel. It should be noted that the phenomenon is caused due to the following reasons. The lower portion 201 of the second defining layer 2 has lyophilic property, causing an upper edge of the first ink 8 to have a serious pinning effect on the inner surface of the lower portion. In conjunction with the adjustment of the drying process, the components of the first ink 8 generate a serious coffee ring effect during the evaporation process. That is, most or all of the solute climbs onto the inner surface of the lyophilic portion 5 of the pixel defining layer. The formed structure is shown in FIGS. 7B and 7C. As can be seen from the figures, the pixel defining layer having a reverse trapezoid structure can enhance the coffee ring effect, such that more solute components of the first ink 8 climb onto the inner surface of the lyophilic portion 5, and the amount of the first ink 8 printed into the pixel can be reduced, which in turn can reduce the first ink 8 that may remain at the central portion of the pixel.

In this step, the amount of the first ink 8 is not specially limited as long as it ensures that the first ink 8 can cover the lyophilic portion 5 of the pixel defining layer after drying. Further, the amount of the first ink 8 may be such that no liquid or as little liquid as possible of the undried first ink 8 remains at the central portion of the pixel.

As shown in FIG. 7C, in step S2, the central portion of the first thin film 9 located at the bottom of the groove is removed. After drying, the solvent of the first ink 8 has been evaporated, and the remaining solute forms the first thin film 9. The central portion of the first thin film 9 is removed, leaving only the edge portion of the first thin film 9. The method for removing the central portion of the first thin film 9 employs an ashing process. The ashing process comprises plasma bombardment, particle beam bombardment, ultraviolet irradiation, or sputtering, etc.

Figure 8A:
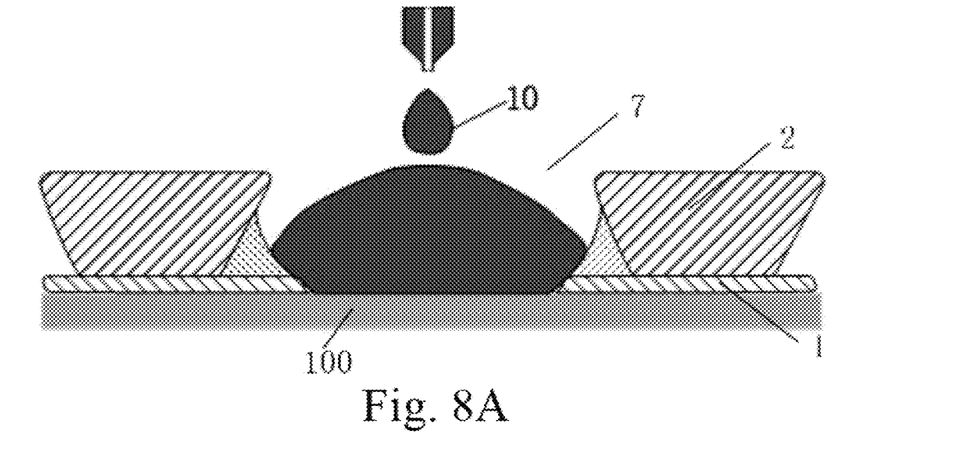
FIGS. 8A to 8B are schematic principle diagrams for explaining the manufacturing process of a second thin film in Embodiment II of the present disclosure.
Figure 8B:
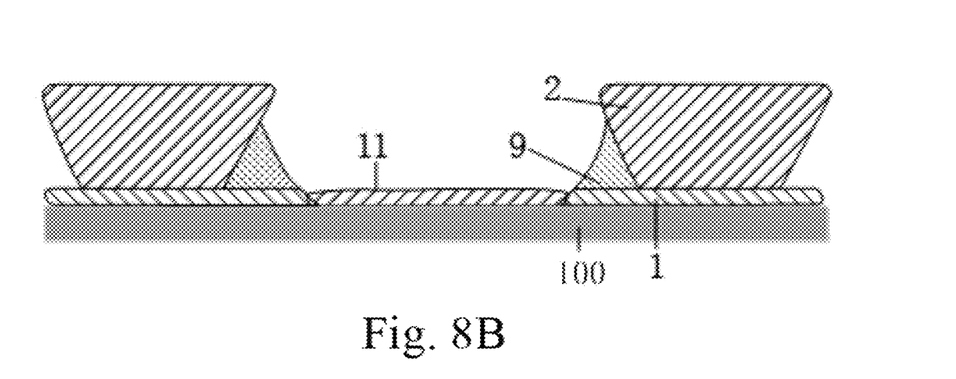

As shown in FIGS. 8A to 8B, in step S3, a second ink 10 is printed within the groove 7 covered with the first thin film 9 described above. The material of the second ink 10 is organic functional material. Optionally, the material of the second ink 10 is hole injection layer material. By a drying process, the second ink 10 is made to form a second thin film 11 that completely covers the surface of the first thin film 9 adjacent the first defining layer 1. Because the lyophilic portion 5 at the inner edge of the pixel defining layer is covered by the lyophobic first thin film 9, significant pinning effect of the second ink 10 thereon can be prevented, such that a uniform thin film can be formed.

To sum up, based on the ink-jet printing method according to the embodiment of the present disclosure, a small amount of the lyophobic first ink 8 is printed within a pixel firstly, such that the lyophilic portion 5 on the inner surface of the pixel defining layer is covered by the first thin film 9 made of the lyophobic first ink 8 after drying, thereby changing the pinning effect of components of the second ink 10 inside the pixel. This can effectively overcome the problem that when an OLED display device is prepared directly by ink-jet printing within a pixel according to the conventional method, the pinning effect of the lyophilic portion 5 of the conventional pixel defining layer results in a non-uniform thin film.

Embodiments of the present disclosure further provide a manufacturing method of an OLED display device, which comprises the steps of the ink-jet printing method described above.

The embodiments described above are merely exemplary embodiments of the present disclosure, but are not intended to limit the protection scope of the present disclosure. The protection scope of the present disclosure should be defined by the appended claims.

The invention claimed is:

1. An ink jet printing method, comprising:
   printing a first ink within a groove defined by a pixel defining layer, such that the first ink forms a first thin film by a drying process, the first thin film covering an inner surface of a lyophilic portion of the pixel defining layer;
   removing a central portion of the first thin film, the central portion being located at the bottom of the groove; and
   printing a second ink into the groove of which the bottom is not covered with the first thin film, such that the second ink forms a second thin film by the drying process.

2. The ink-jet printing method according to claim 1, wherein the cross-sectional shape of the pixel defining layer is one of a forward trapezoid and a reverse trapezoid.

3. The ink-jet printing method according to claim 2, wherein the pixel defining layer comprises a first defining layer formed on a substrate and a second defining layer located on the first defining layer, the first defining layer and a lower portion of the second defining layer being a lyophilic portion, and an upper portion of the second defining layer being a lyophobic portion.

4. The ink jet printing method according to claim 3, wherein a material of the first defining layer is one of silicon oxide and silicon nitride, and a material of the second defining layer is polymer resin.

5. The ink jet printing method according to claim 2, wherein a solute of the first ink is a low surface energy material.

6. The ink-jet printing method according to claim 5, wherein the solute of the first ink comprises one of fluorine-containing resin and fluorine-containing dendritic macromolecule material.

7. The ink jet printing method according to claim 2, wherein the central portion of the first thin film located at the bottom of the groove is removed by an ashing process.

8. The ink jet printing method according to claim 7, wherein the ashing process comprises one of plasma bombardment, particle beam bombardment and ultraviolet irradiation.

9. The ink jet printing method according to claim 2, wherein a material of the second ink is organic functional material.

10. The ink jet printing method according to claim 9, wherein the material of the second ink comprises hole injection layer material.

11. The ink-jet printing method according to claim 1, wherein the pixel defining layer comprises a first defining layer formed on a substrate and a second defining layer located on the first defining layer, the first defining layer and a lower portion of the second defining layer being a lyophilic portion, and an upper portion of the second defining layer being a lyophobic portion.

12. The ink jet printing method according to claim 11, wherein a material of the first defining layer is one of silicon oxide and silicon nitride, and a material of the second defining layer is polymer resin.

13. The ink-jet printing method according to claim 1, wherein a solute of the first ink is a low surface energy material.

14. The ink jet printing method according to claim 13, wherein the solute of the first ink comprises one of fluorine-containing resin and fluorine-containing dendritic macromolecule material.

15. The ink-jet printing method according to claim 1, wherein the central portion of the first thin film located at the bottom of the groove is removed by an ashing process.

16. The ink jet printing method according to claim 15, wherein the ashing process comprises one of plasma bombardment, particle beam bombardment and ultraviolet irradiation.

17. The ink-jet printing method according to claim 1, wherein a material of the second ink is organic functional material.

18. The ink-jet printing method according to claim 17, wherein the material of the second ink comprises hole injection layer material.

19. A manufacturing method of an OLED display device, comprising:
   printing a first ink within a groove defined by a pixel defining layer, such that the first ink forms a first thin film by a drying process, the first thin film covering an inner surface of a lyophilic portion of the pixel defining layer;
   removing a central portion of the first thin film, the central portion being located at the bottom of the groove; and
   printing a second ink into the groove of which the bottom is not covered with the first thin film, such that the second ink forms a second thin film by the drying process.

20. The manufacturing method according to claim 19, wherein a material of the second ink is organic functional material.

\* \* \* \* \*